(12) United States Patent
Sparrow

(10) Patent No.: US 6,768,762 B2
(45) Date of Patent: Jul. 27, 2004

(54) HIGH REPETITION RATE UV EXCIMER LASER

(75) Inventor: Robert W. Sparrow, Sturbridge, MA (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 10/459,012

(22) Filed: Jun. 10, 2003

(65) Prior Publication Data

US 2003/0210726 A1 Nov. 13, 2003

Related U.S. Application Data

(63) Continuation of application No. 10/087,265, filed on Mar. 1, 2002.
(60) Provisional application No. 60/272,814, filed on Mar. 2, 2001.

(51) Int. Cl.[7] .............................. H01S 3/22; H01S 3/14; H01S 3/097; H01S 3/09; H01S 3/08; H01S 3/10
(52) U.S. Cl. .............................. 372/57; 372/55; 372/58; 372/68; 372/87; 372/90; 372/23; 372/101; 372/103; 372/108

(58) Field of Search .............................. 372/57, 23, 58, 372/55, 68, 87, 90, 101, 103, 108, 100

(56) References Cited

U.S. PATENT DOCUMENTS

2001/0043331 A1 * 11/2001 Rebhan .............................. 356/432
2002/0044586 A1 * 4/2002 Myers et al. .............................. 372/57

FOREIGN PATENT DOCUMENTS

RU 2041298 C1 8/1995

* cited by examiner

Primary Examiner—Don Wong
Assistant Examiner—Armando Rodriguez
(74) Attorney, Agent, or Firm—Walter M Douglas

(57) ABSTRACT

The invention relates to an High Repetition Rate UV Excimer Laser which includes a source of a laser beam and one or more windows which include magnesium fluoride. Another aspect of the invention relates to an excimer laser which includes a source of a laser beam, one or more windows which include magnesium fluoride and a source for annealing the one or more windows. Another aspect of the invention relates to a method of producing a predetermined narrow width laser beam.

16 Claims, 3 Drawing Sheets

HIGH REPETITION RATE UV EXCIMER LASER

This application is a Continuation of claims of U.S. patent application Ser. No. 10/087,265, filed Mar. 1, 2002, and titled "High Repitition Rate UV Excimer Laser", that in turn claims priority to U.S. Provisional Patent Application No. 60/272,814, filed Mar. 2, 2001, both of which are hereby incorporated by reference.

FIELD OF THE INVENTION

The subject invention is directed generally to an High Repetition Rate UV Excimer Laser.

BACKGROUND OF THE INVENTION

Throughout this application various publications are referenced. The disclosures of each of these publications in their entireties are hereby incorporated by reference in this application.

Excimer lasers have been conventionally developed for commercial use as a light source of a reducing projection and exposure device for a semiconductor manufacturing apparatus, because an excimer laser enables extremely precise work.

Light oscillating from the excimer laser has various wavelength components and the central wavelength varies. As a result, if the light is in the as-is status, an aberration will occur when the light passes through an external optical element, such as a lens, thereby reducing the accuracy of the work. For this reason, there is a widely used art of making a narrow band, in which an excimer laser is equipped with a wavelength selecting element, such as a grating, to narrow the spectral width of the laser oscillation wavelength and to stabilize the central wavelength as a central value of the oscillation wavelength.

U.S. Pat. No. 6,181,724 discloses an excimer laser. Laser gas is sealed in a laser chamber and energy is supplied as a result of an electrical discharge in a discharge electrode, causing the laser beam to oscillate. The oscillating laser beam exits through a rear window, the beam size is widened while passing through a first prism and a second prism, and then the laser beam enters a grating. In the grating, an angle relative to the light path of the laser beam is controlled by an actuator and by oscillating the laser beam at a predetermined wavelength, a narrow band is achieved. A group of optical components, which are the first prism, the second prism, and the grating, is collectively called the narrow-band optics. The laser beam, with the wavelength being controlled by the narrow-band optics, passes through a front window and a front mirror, which is a partial reflecting mirror, and part of the laser beam exits the laser chamber.

Typically, synthetic fused silica or calcium fluoride is used as the material of the optical components for the excimer lasers, however, there are significant disadvantages in using these materials; for example, laser included absorption as a result of the use high fluence radiation. In order to manufacture semiconductors efficiently in large quantities, there has been a demand to increase the power of a laser by increasing the laser oscillation pulse numbers per unit time (also called the repetition frequency or repetition rate). However, the energy density is high in the resonator of the laser, and moreover, a laser beam reciprocates in the resonator and passes through the optical components many times. For this reason, as the power of a laser becomes higher, the optical components are deteriorated as a result of even minor distortion or unevenness inside the material. Even minor deterioration of the optical components exerts a great influence on the quality of the oscillating laser beam. Thus, the optical components of synthetic fused silica or calcium fluoride are insufficient in durability when the power of an excimer laser is increased, and a highly accurate control of the wavelength of an High Repetition Rate UV Excimer Laser is difficult when these optical components are used. It is one of the objects of this invention to overcome these laser induced problems, for example in calcium fluoride, by the use of an in situ annealing process using a secondary laser beam.

SUMMARY OF THE INVENTION

The present invention relates to an High Repetition Rate ($\geq 4$ kilohertz) UV Excimer Laser which includes a source of a laser beam and one or more windows which include magnesium fluoride.

Another aspect of the present invention includes an High Repetition Rate UV Excimer Laser which includes a source for a laser beam, one or more windows which include magnesium fluoride, and a source for annealing the one or more windows, such annealing reducing laser induced absorption problems.

Yet another aspect of the present invention includes an High Repetition Rate UV Excimer Laser window which includes magnesium fluoride.

Yet another aspect of the present invention includes a method of producing a predetermined narrow width laser beam. The method includes oscillating a laser beam whereby the laser beam exits a first window of a chamber, widening the laser beam through one or more prisms, controlling the laser beam to a predetermined narrow width, and passing the predetermined narrow width laser beam through a second window of the chamber, where the first and second windows of the chamber include magnesium fluoride.

BRIEF DESCRIPTION OF THE DRAWINGS

These and other features and advantages of this invention will be evident from the following detailed description of preferred embodiments when read in conjunction with the accompanying drawings in which.

DETAILED DESCRIPTION OF THE INVENTION

The present invention relates to an excimer laser which includes a source of a laser beam and one or more windows which include magnesium fluoride.

Excimer laser devices are described in U.S. Pat. Nos. 6,181,724, 6,282,221, 6,067,311 and 6,014,398, which are hereby incorporated by reference.

Typically, an excimer laser operates as follows. Laser gas is sealed in a laser chamber and energy is supplied to the gas by an electrical discharge in a discharge electrode. This causes the laser beam to oscillate. The oscillating laser beam exits the laser chamber through a rear window, the size of the laser beam is widened while passing through prisms, and the laser beam enters a grating. In the grating, an angle relative to the light path of the laser beam is controlled by an actuator and by oscillating a predetermined wavelength a narrow band width is achieved. The laser beam, with the controlled wavelength passes through a front window and a front mirror and part of the laser beam exits the laser chamber.

Figure 1:
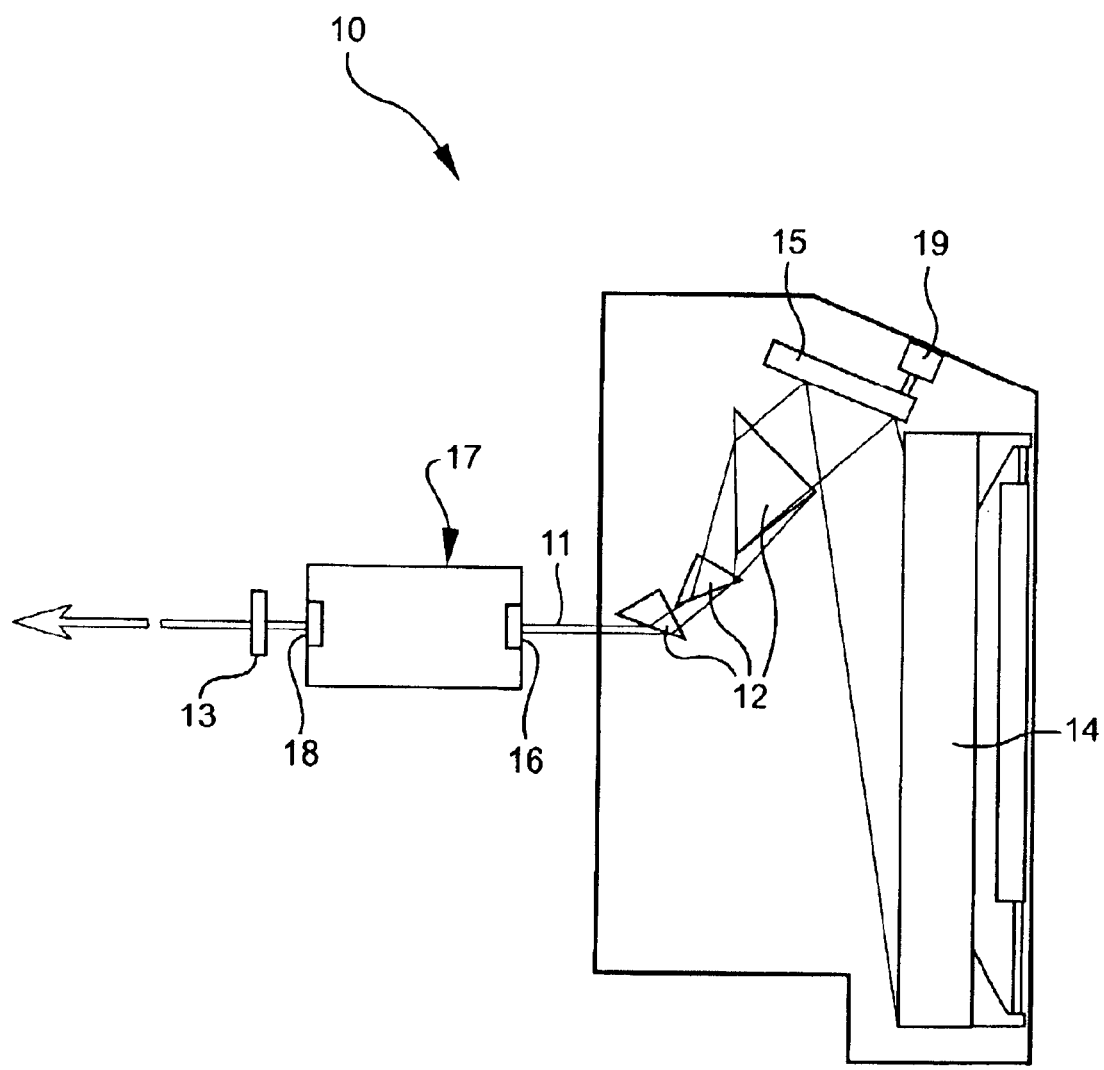
FIG. 1 illustrates an High Repetition Rate UV Excimer Laser according to one embodiment of the present invention.

With this general view of the operation of an excimer laser in mind, FIG. 1 illustrates one embodiment of an High Repetition Rate UV Excimer Laser of the present invention. As shown in FIG. 1, High Repetition Rate UV Excimer Laser device 10 includes a plurality of prisms such as first and second (and optionally third) prisms 12, first mirror 13, second mirror 15, a grating 14, and first 16 and second 18 windows. First window 16 and second window 18 in laser chamber 17 form an ordinary Brewster angle relative to a laser beam 11 in order to reduce energy loss. Components, such as plurality of prisms 12, first mirror 13 and second mirror 15, and first window 16 and second window 18 are made of a fluoride optical material, such as calcium fluoride, barium fluoride or magnesium fluoride. In one embodiment, these components are made of magnesium fluoride. In an alternative embodiment, first window 16 and second window 18 are made of magnesium fluoride and other components, such as plurality of prisms 12, first mirror 13 and second mirror 15 are made of other materials, such as calcium fluoride.

Another aspect of the present invention includes a method of producing a predetermined narrow width laser beam. The method includes oscillating a laser beam where the laser beam exits a first window of a chamber, widening the laser beam through one or more prisms, controlling the laser beam to a predetermined narrow width, and passing the predetermined narrow width laser beam through a second window of the chamber, where the first and second windows of the chamber include magnesium fluoride.

In use, referring to FIG. 1, laser gases (such as Ar, Kr, Ne and/or F) are sealed in laser chamber 17 and energy is supplied to the laser gas by an electrical discharge in a discharge electrode (not shown). This causes laser beam 11 to oscillate. Oscillating laser beam 11 exits the laser chamber 17 through a rear window 16. Laser beam 11 passes through prisms 12, is reflected by second mirror 15 and grating 14. In first mirror 15, an angle relative to the light path of laser beam 11 is controlled by an actuator. By oscillating laser beam 11 at predetermined wavelength, a narrow band width is achieved for laser beam 11. Laser beam 11 is totally reflected by grating 14 and second mirror 15 causing laser beam 11 to reverse its original path and exit chamber 17 from front window 18 and exit from first mirror 13.

Figure 2:
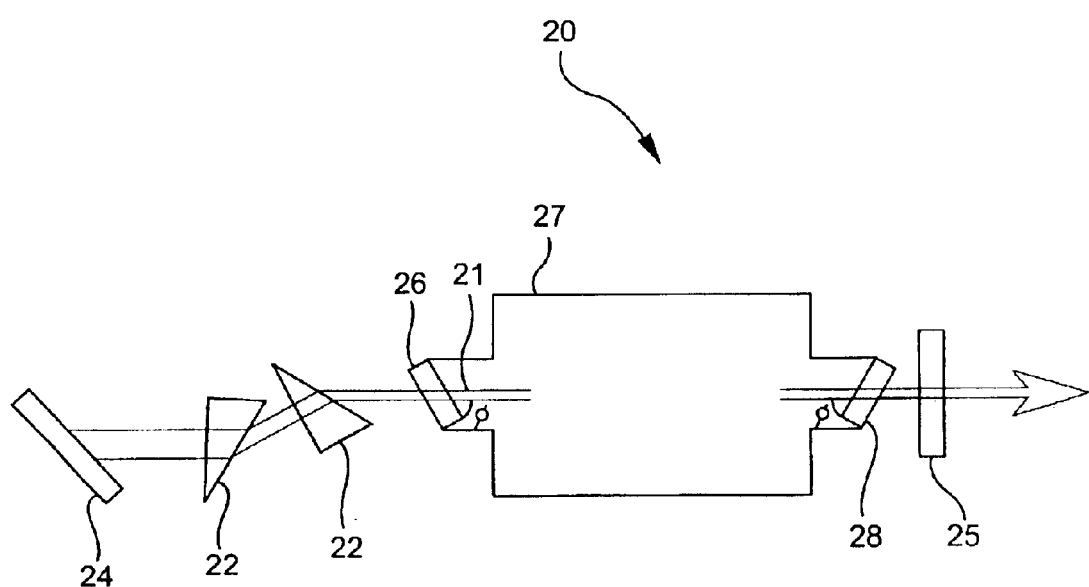
FIG. 2 illustrates an High Repetition Rate UV Excimer Laser according to an alternative embodiment of the present invention.

FIG. 2 is a second embodiment of the present invention. High Repetition Rate UV Excimer Laser device 20 includes a plurality of prisms such as first and second prisms 22, mirror 25, grating 24, and first 26 and second 28 windows. First window 26 and second window 28 in laser chamber 27 form an ordinary Brewster angle relative to a laser beam 21 in order to reduce energy loss. In this embodiment, laser beam 21, is partially reflected by mirror 25, which is a partially reflecting mirror, and part of laser beam 21 exits laser chamber 27. Components, such as plurality of prisms 22, second mirror 25, and first window 26 and second window 28 are made of a fluoride optical material, such as calcium fluoride, barium fluoride or magnesium fluoride. In one embodiment, these components are made of magnesium fluoride. In an alternative embodiment, first window 26 and second window 28 are made of magnesium fluoride and other components, such as plurality of prisms 22 and mirror 25 are made of other materials, such as calcium fluoride.

Another aspect of the present invention includes an High Repetition Rate UV Excimer Laser window made of magnesium fluoride.

The laser windows of the present invention made of magnesium fluoride maintain durability over a long operational life of the High Repetition Rate UV Excimer Laser. As used herein, "maintain durability" means that the magnesium fluoride windows have no perceptible induced absorption. The magnesium fluoride windows maintain durability for a laser having a output of greater than or equal to 10 mJ and a repetition rate of greater than or about 4 KHz. Further, the magnesium fluoride windows of the present invention maintain durability for a laser having a output of greater than or equal to 10 mJ and a repetition rate of greater than or about 4 KHz for over 500 million pulses and, optionally, for over 900 million pulses.

Another aspect of the present invention includes an excimer laser which includes a source for a laser beam, one or more windows which include magnesium fluoride, and a source for annealing the one or more windows.

Figure 3:
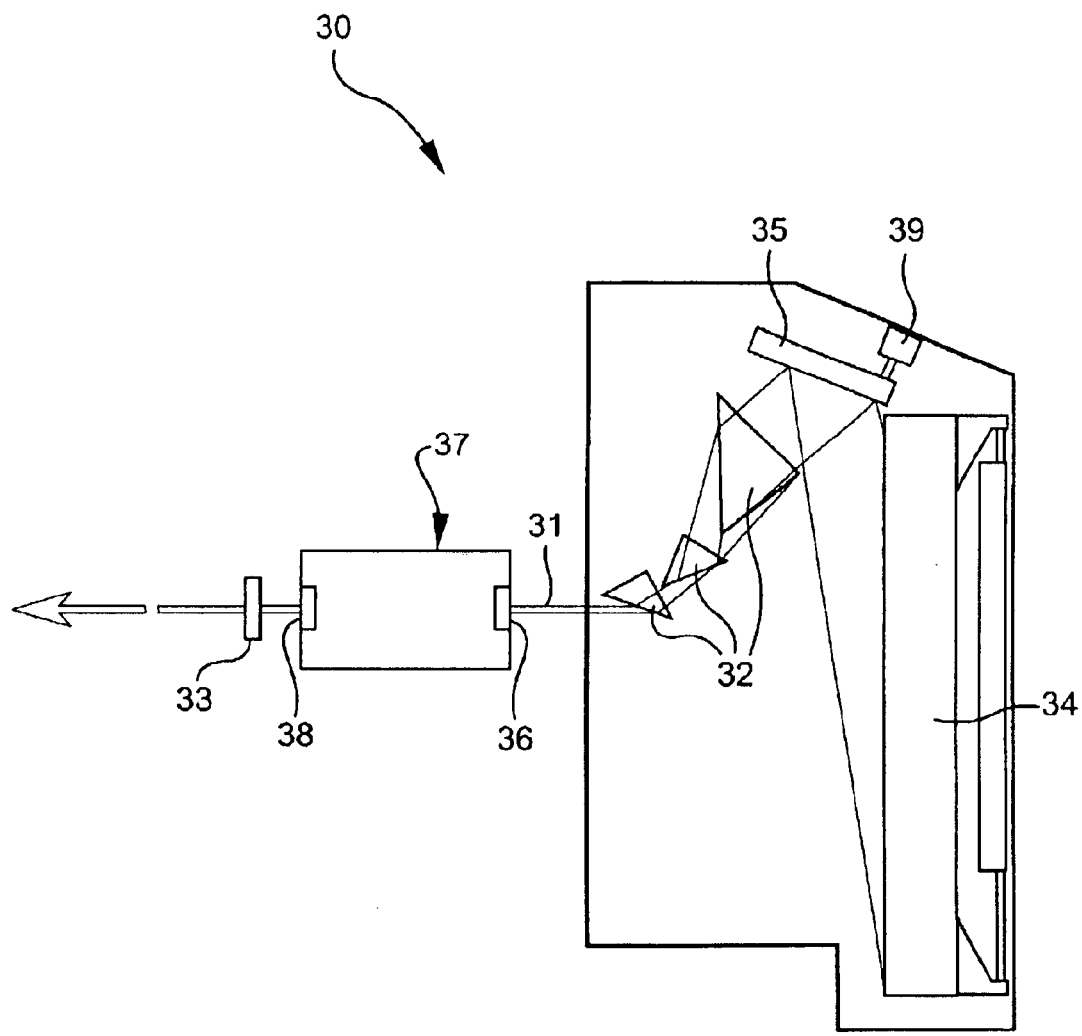
FIG. 3 illustrates an High Repetition Rate UV Excimer Laser according to an alternative embodiment of the present invention.

FIG. 3 shows an embodiment of the present invention which includes a source for annealing the windows of the laser chamber. As shown in FIG. 3, excimer laser device 30 includes a plurality of prisms such as first and second (and optionally third) prisms 32, first mirror 33, second mirror 35, a grating 14, and first 16 and second 18 windows. First window 36 and second window 38 in laser chamber 37 form an ordinary Brewster angle relative to a laser beam 31 in order to reduce energy loss. Components, such as plurality of prisms 32, first mirror 33 and second mirror 35, and first window 36 and second window 38 are made of a fluoride optical material, such as calcium fluoride, barium fluoride or magnesium fluoride. In one embodiment, these components are made of magnesium fluoride. In an alternative embodiment, first window 36 and second window 38 are made of magnesium fluoride and other components, such as plurality of prisms 32, first mirror 33 and second mirror 35 are made of other materials, such as calcium fluoride.

Typically, a first laser beam (as described above) and a second laser beam are generated by discharge electrode in laser chamber 37. In use, referring to FIG. 3, a second laser gas (such as Ar, Kr, Ne and/or F) is sealed in laser chamber 37 and energy is supplied to the second laser gas by a second electrical discharge in a second discharge electrode (not shown). This causes a second laser beam 31 to oscillate. Oscillating laser beam 31 exits the laser chamber 37 through a rear window 36. Laser beam 31 passes through prisms 32, is reflected by second mirror 35 and grating 34. In second mirror 35, an angle relative to the light path of laser beam 31 is controlled by an actuator. By oscillating laser beam 31 at predetermined wavelength, a narrow band width is achieved for laser beam 31. Laser beam 31 is totally reflected by grating 34 and second mirror 35 causing laser beam 31 to reverse its original path and exit chamber 37 from front window 38 and exit from first mirror 33.

Second laser beam 31 is used to anneal first and second windows 38 and 36 concurrently with operation of the excimer laser. The windows are irradiated with second laser beam 31 with light having a wavelength of about 250 nm. This wavelength corresponds to the wavelength of the induced absorption band. Alternately, second laser beam 31 is used either before or after operation of the excimer laser to anneal first and second windows 36 and 38 while the eximer laser is not in use.

Alternatively, windows 36 and 38 are thermally annealed. Thermal annealing is accomplished by heating first and/or second windows in an environment such as an inert gas or under vacuum. Although the temperature to which the windows are heated is dependent on the level of induced absorption, a temperature of from about 200 to about 800° C. is typical.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the claims which follow.

What is claimed is:

1. A method of producing a $\geq 4$ kilohertz repetition rate excimer laser having a $\geq 4$ kilohertz laser beam and a second laser beam suitable for annealing optical components of the laser, said method comprising:

providing a $\geq 4$ kilohertz repetition rate excimer laser for producing a first $\geq 4$ kilohertz repetition rate laser beam and a second laser beam suitable for annealing optical components of the laser, said laser comprised of a laser chamber and a first and a second discharge electrode, said laser chamber having a first optical fluoride crystal window and a second optical fluoride crystal window with a laser gas for generating said first and second laser beams sealed in said chamber between said optical fluoride crystal windows;

wherein an electrical discharge from said first electrode supplies energy to said laser gas to produce a $\geq 4$ kilohertz repetition rate laser beam and an electrical discharge from said second electrode supplies energy to said laser gas to produce said second laser beam for annealing said optical components, and oscillating said first laser beam whereby the first laser beam exits said first optical fluoride crystal window of said chamber and passing the first laser beam through said second optical fluoride crystal window of the chamber to provide said $\geq 4$ kilohertz repetition rate excimer laser beam; and oscillating said second laser beam whereby the second laser beam exits said first optical fluoride crystal window of said chamber and passing the second laser beam through said second optical fluoride crystal window of the chamber to provide said second annealing laser beam;

wherein said excimer laser is a $\geq 10$ mJ power excimer laser and said first $\geq 4$ kilohertz repetition rate laser beam has a power $\geq 10$ mJ.

2. A method as claimed in claim 1 wherein the optical fluoride crystal windows have a durability of more than 500 million pulses.

3. An excimer laser according to claim 1, wherein said $\geq 4$ kilohertz repetition rate excimer laser gas is an argon fluoride excimer laser gas.

4. An excimer laser according to claim 1, wherein said $\geq 4$ kilohertz repetition rate excimer laser gas is a krypton fluoride excimer laser gas.

5. An excimer laser according to claim 3 further comprising:

a source gas and a second discharge electrode for producing a second laser beam, said second laser bean being used for annealing said windows.

6. The method according to claim 1, wherein the optical fluoride is selected from the group consisting of calcium fluoride, barium fluoride, magnesium fluoride.

7. The method according to claim 6, wherein the optical fluoride is magnesium fluoride.

8. The method according to claim 1, wherein said second laser beam can be generated and used to anneal said optical fluoride components before, during and after the operation of said first laser beam.

9. An excimer laser comprising:

A chamber having one or more windows comprising an optical fluoride;

a first source for a first excimer laser beam within said chamber; and a second source within said chamber for a second laser beam for annealing the one or more of said comprising optical fluoride crystal windows;

wherein said first and second laser beams are generated in said chamber by a first and a second discharge electrode, respectively, and said second annealing laser beam can be operated for annealing said windows before, during or after operation of said first laser beam.

10. An excimer laser according to claim 9, wherein the laser beam has a power of greater than or equal to 10 mJ.

11. An excimer laser according to claim 9, wherein the first laser beam has a repetition rate of greater than or equal to $\geq 4$ KHz.

12. An excimer laser according to claim 9, wherein the laser beam source for the first and second laser beams is argon fluoride.

13. An excimer laser according claim, 9 wherein the laser beam source for the first and second laser beams is krypton fluoride.

14. The excimer laser according to claim 9, wherein the optical fluoride is selected from the group consisting of calcium fluoride, barium fluoride, magnesium fluoride.

15. The excimer laser according to claim 14, wherein the optical fluoride is calcium fluoride.

16. The excimer laser according to claim 14, the optical fluoride is magnesium fluoride.

* * * * *